(12) United States Patent
Iizuka

(10) Patent No.: US 8,221,581 B2
(45) Date of Patent: Jul. 17, 2012

(54) GAS SUPPLY MECHANISM AND SUBSTRATE PROCESSING APPARATUS

(75) Inventor: Hachishiro Iizuka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1086 days.

(21) Appl. No.: 12/127,311

(22) Filed: May 27, 2008

(65) Prior Publication Data

US 2008/0314523 A1 Dec. 25, 2008

Related U.S. Application Data

(60) Provisional application No. 60/971,942, filed on Sep. 13, 2007.

(30) Foreign Application Priority Data

Jun. 25, 2007 (JP) .................................. 2007-166863

(51) Int. Cl.
*C23C 16/00* (2006.01)
*C23C 16/455* (2006.01)
*C23C 16/50* (2006.01)
*H01L 21/3065* (2006.01)

(52) U.S. Cl. ......... 156/345.34; 156/345.33; 156/345.43; 156/345.47; 118/715; 118/723 R; 118/723 E

(58) Field of Classification Search .................. 118/715, 118/723 R, 723 E; 156/345.33, 345.34, 345.43, 156/345.47
See application file for complete search history.

(56) References Cited

U.S. PATENT DOCUMENTS

| | | | |
|---|---|---|---|
| 2003/0143328 A1* | 7/2003 | Chen et al. | 427/255.28 |
| 2005/0241765 A1* | 11/2005 | Dhindsa et al. | 156/345.34 |
| 2005/0241766 A1* | 11/2005 | Dhindsa et al. | 156/345.34 |
| 2006/0075966 A1* | 4/2006 | Chen et al. | 118/723 E |
| 2006/0234514 A1* | 10/2006 | Gianoulakis et al. | 438/758 |
| 2008/0314523 A1* | 12/2008 | Iizuka | 156/345.34 |
| 2009/0255631 A1* | 10/2009 | Sato | 156/345.43 |
| 2009/0301655 A1* | 12/2009 | Yokogawa et al. | 156/345.24 |
| 2010/0151687 A1* | 6/2010 | Dhindsa et al. | 438/710 |

FOREIGN PATENT DOCUMENTS

JP 2003-257937 9/2003

* cited by examiner

*Primary Examiner* — Jeffrie R Lund
(74) *Attorney, Agent, or Firm* — Oblon, Spivak, McClelland, Maier & Neustadt, L.L.P.

(57) ABSTRACT

A processing gas supply hole is constituted with a gas outlet hole formed at an electrode plate and a gas injection hole formed at a processing gas supply mechanism main unit. At the gas injection hole, a processing gas having flowed in on the upstream side is injected toward the gas outlet hole through an injection opening of a nozzle portion disposed on the downstream side, so as to generate a suction force at a suction flow passage formed around the nozzle portion by taking advantage of the ejector defect.

20 Claims, 8 Drawing Sheets

GAS SUPPLY MECHANISM AND SUBSTRATE PROCESSING APPARATUS

CROSS-REFERENCE TO RELATED APPLICATIONS

This document claims priority to Japanese Patent Application Number 2007-166863 filed on Jun. 25, 2007 and U.S. Provisional Application No. 60/971,942, filed on Sep. 13, 2007, the entire content of which are hereby incorporated by reference.

FIELD OF THE INVENTION

The present invention relates to a gas supply mechanism with which processing gas is supplied into a processing chamber and it also relates to a substrate processing apparatus.

BACKGROUND OF THE INVENTION

Semiconductor integrated circuits of a specific desired type are normally formed through a semiconductor device manufacturing process during which various types of processing such as film formation processing, etching, heat processing, refining and crystallization processing are executed repeatedly on a processing target substrate, e.g., a semiconductor wafer (hereafter may simply be referred to as a "wafer") or a glass substrate. Such processing is executed by delivering a specific processing gas corresponding to the particular type of processing being executed into a processing chamber.

For instance, a plane-parallel plasma processing apparatus equipped with an upper electrode and a lower electrode disposed inside a processing chamber as disclosed in Japanese Laid Open Patent Publication No. 2003-257937 is normally used in an etching process. The lower electrode also functions as a stage on which the processing target substrate is placed, with its upper surface formed so that it supports the processing target substrate levelly. The upper electrode, which also functions as a gas supply device utilized to deliver the processing gas into the processing chamber, is disposed above the lower electrode so as to face opposite the lower electrode.

A gas supply pipe is connected to the upper electrode and a processing gas supplied through the gas supply pipe travels inside the upper electrode and is then injected toward the processing target substrate placed on the lower electrode through numerous gas injection holes formed at the lower surface of the upper electrode. As high-frequency power is applied to the upper electrode and the lower electrode during this process, the processing gas supplied into the space above the processing target substrate is raised to plasma. The plasma thus generated is used to etch a film formed on the processing target substrate or to form a specific type of film over the processing target substrate.

A structural example adopted in an upper electrode in the related art, which includes a processing gas supply mechanism such as that described above, is now explained in reference to a drawing. FIG. 7 schematically illustrates the structure of the upper electrode in a sectional view. The upper electrode 10 in FIG. 7 is constituted with a processing gas supply mechanism main unit 12 and a plate-type electrode 16 layered over the lower surface of the processing gas supply mechanism main unit 12.

An electrode rod 18 via which a high-frequency voltage originating from a high-frequency power source (not shown) is supplied to the upper electrode 10 is disposed near the center at the top of the processing gas supply mechanism main unit 12. In addition, a gas supply pipe 20 through which the processing gas is supplied to the upper electrode 10 is connected via a processing gas delivery port 22 at the top of the processing gas supply mechanism main unit 12.

Inside the processing gas supply mechanism main unit 12, a diffusion chamber 24 through which the processing gas delivered from the gas supply pipe 20 via the processing gas delivery port 22 is diffused along the horizontal direction is formed. A plurality of processing gas supply holes 25, which range from the diffusion chamber 24 through the lower surface of the electrode plate 16 are formed so as to pass through the processing gas supply mechanism main unit 12 and the electrode plate 16.

At the upper electrode 10 structured as described above, the processing gas delivered into the diffusion chamber 24 via the processing gas delivery port 22 is diffused and distributed toward the individual processing gas supply holes 25. The processing gas then travels through the various processing gas supply holes 25 and is let out downward.

As plasma is generated in the processing chamber of a plasma processing apparatus equipped with the upper electrode 10, the temperature of the upper electrode 10 rises due to the heat input from the plasma. In addition, as the stage is heated during the plasma processing, for instance, the heat radiated from the stage raises the temperature of the upper electrode 10 as well. Such an increase in the temperature of the upper electrode causes thermal expansion of both the processing gas supply mechanism main unit 12 and the electrode plate 16 constituting the upper electrode 10.

Since the processing gas supply mechanism main unit 12 and the electrode plate 16 are normally constituted of materials with different coefficients of thermal expansion, the processing gas supply mechanism main unit 12 and the electrode plate 16 thermally expand to different extents. For instance, if the processing gas supply mechanism main unit 12 is constituted of aluminum and the electrode plate 16 is constituted of quartz, the processing gas supply mechanism main unit 12 will thermally expand to a greater extent along the lateral direction than the electrode plate 16, since the coefficient of thermal expansion of aluminum is greater than the coefficient of thermal expansion of quartz.

However, if the upper electrode 10 is surrounded by a shield ring (not shown) or the like disposed along the edge thereof, the thermal expansion of the processing gas supply mechanism main unit 12 along the horizontal direction is restricted by the shield ring or the like, causing the processing gas supply mechanism main unit to start warping slightly ahead of the electrode plate 16, as the process of thermal expansion progresses. Such a slight extent of warping creates a small gap at the boundary of the processing gas supply mechanism main unit 12 and the electrode plate 16. Under such circumstances, some of the processing gas flowing through the processing gas supply holes 25 will leak through the gap 25, as shown in FIG. 8.

The processing gas leak through the gap formed at the boundary of the processing gas supply mechanism main unit 12 and the electrode plate 16 occurring due to the thermal expansion and the like as described above will reduce the flow rate of the processing gas let out through the processing gas supply holes 25. In such a case, since the processing gas is not let out through the processing gas supply holes 25 at the expected flow rate, the target area on the wafer, which should be processed with the processing gas supplied through the processing gas supply holes 25 at the expected flow rate, can no longer be processed at the desired film formation rate or etching rate and thus, the desired processing results may not be achieved.

In addition, the processing gas leaking from a processing gas supply hole 25 may travel through the gap 26 at the boundary of the processing gas supply mechanism main unit 12 and the electrode plate 16 to flow into another processing gas supply hole 25, e.g., an adjacent processing gas supply hole 25. As a result, the processing gas may be let out through the various processing gas supply holes 25 at different flow rates. Furthermore, since numerous processing gas supply holes 25 are formed over the entire surface of the electrode plate 16, the temperature distribution at a given processing gas supply hole is bound to be different from the temperature distribution at another processing gas supply hole. This means that the thermal expansion will occur to varying extents, which, in turn, results in the processing gas leaked through the individual processing gas supply holes in different quantities. In other words, the processing gas may not be let out through the various processing gas supply holes 25 at the uniform flow rate. If such inconsistency is significant, the required level of processing uniformity may not be achieved within the plane of the wafer W.

SUMMARY OF THE INVENTION

Accordingly, an object of the present invention, having been achieved by addressing the issues discussed above, is to provide a gas supply mechanism and a substrate processing apparatus with which a processing gas leak through a gap formed due to thermal expansion or the like between different members in the processing gas supply mechanism formed by layering a plurality of members, is prevented.

The object described above is achieved in an aspect of the present invention by providing a processing gas supply mechanism that is disposed so as to face opposite a stage inside a processing chamber and supplies a processing gas toward a processing target substrate held on the stage comprising a processing gas delivery port through which the processing gas is delivered, a processing gas supply mechanism main unit having formed therein a diffusion chamber through which the processing gas delivered through the processing gas delivery port is diffused, a plate member layered over the processing gas supply mechanism main unit on a side thereof toward the stage and constituted of a material with a coefficient of thermal expansion different from the processing gas supply mechanism main unit and a plurality of processing gas supply holes through which the processing gas is supplied into the processing chamber from the diffusion chamber. The processing gas supply holes are each constituted with a gas outlet hole formed at the plate member and a gas injection hole formed at the processing gas supply mechanism main unit with the gas injection hole formed so that the processing gas flowing in from the diffusion chamber communicating with a gas injection hole on an upstream side thereof is injected toward the gas outlet hole from an injection opening at a nozzle portion disposed on a downstream side thereof. A suction flow passage with an upstream side thereof communicating with a boundary of the gas supply mechanism main unit and the plate member and a downstream side thereof connecting to the gas outlet hole, is formed around the nozzle portion.

The object described above is also achieved in another aspect of the present invention by providing a substrate processing apparatus that executes a specific type of processing on a processing target substrate placed on a stage inside a processing chamber by supplying processing gas into the processing chamber from a processing gas supply mechanism disposed so as to face opposite the stage in the processing chamber. The processing gas supply mechanism comprises a processing gas delivery port through which the processing gas is delivered, a processing gas supply mechanism main unit having formed therein a diffusion chamber through which the processing gas delivered through the processing gas delivery port is diffused, a plate member layered over the processing gas supply mechanism main unit on a side thereof toward the stage and constituted of a material with a coefficient of thermal expansion different from the processing gas supply mechanism main unit and a plurality of processing gas supply holes through which the processing gas is supplied into the processing chamber from the diffusion chamber. The processing gas supply holes are each constituted with a gas outlet hole formed at the plate member and a gas injection hole formed at the processing gas supply mechanism main unit with the gas injection hole formed so that the processing gas flowing in from the diffusion chamber communicating with the gas injection hole on an upstream side thereof is injected toward the gas outlet hole from an injection opening at a nozzle portion disposed on a downstream side thereof. A suction flow passage with an upstream side thereof communicating with a boundary of the gas supply mechanism main unit and the plate member and a downstream side thereof connecting to the gas outlet hole is formed around the nozzle portion.

The object described above is also achieved in yet another aspect of the present invention by providing a substrate processing apparatus that executes a specific type of processing on a processing target substrate placed on a stage inside a processing chamber with plasma raised from a processing gas by applying high-frequency power to an electrode disposed so as to face opposite the stage in the processing chamber. The electrode comprises a processing gas delivery port through which the processing gas is delivered, a processing gas supply mechanism main unit having formed therein a diffusion chamber through which the processing gas delivered through the processing gas delivery port is diffused, an electrode plate layered over the processing gas supply mechanism main unit on a side thereof toward the stage and constituted of a material with a coefficient of thermal expansion different from the processing gas supply mechanism main unit and a plurality of processing gas supply holes through which the processing gas is supplied into the processing chamber from the diffusion chamber. The processing gas supply holes are each constituted with a gas outlet hole formed at the plate member and a gas injection hole formed at the processing gas supply mechanism main unit with the gas injection hole formed so that the processing gas flowing in from the diffusion chamber communicating with the gas injection hole on an upstream side thereof is injected toward the gas outlet hole from an injection opening at a nozzle portion disposed on a downstream side thereof. A suction flow passage with an upstream side thereof communicating with a boundary of the gas supply mechanism main unit and the plate member and a downstream side thereof connecting to the gas outlet hole is formed around the nozzle portion.

According to the present invention described above, the processing gas delivered into the processing gas supply mechanism main unit through the processing gas delivery port is diffused in the diffusion chamber, distributed toward the various processing gas supply holes and is then supplied into the processing chamber via the individual processing gas supply holes. During this process, the ejector effect manifesting at each processing gas supply hole whereby the processing gas injected through the injection opening at the nozzle portion toward the gas outlet hole forms a driving flow, creates a suction force in the suction flow passage, which is directed toward the gas outlet hole from the boundary of the gas supply mechanism main unit and the plate member. Thus, even if a gap is formed at the boundary of the gas supply mechanism main unit and the plate member due to thermal expansion or the like, a processing gas leak into the gas is prevented. In addition, even if a leak occurs, the processing gas having leaked creates a suction flow traveling through the suction flow passage to flow into the gas outlet hole where it joins the processing gas injected through the injection openings and thus, the leaked processing gas, too, is let out into the processing chamber through the gas outlet hole.

Ultimately, even when a gap is formed due to thermal expansion or the like between members in the processing gas supply mechanism formed by layering a plurality of members, a processing gas leak through the gas is prevented. This means that even when thermal expansion occurs, the processing gas can be let out through all the processing gas supply holes at the expected specific flow rate at all times, enabling desired processing to be executed over the entire surface of the processing target substrate.

In addition, the nozzle portion may be formed so as to project into the gas outlet hole through the layering surface of the processing gas supply mechanism main unit at which the plate member is layered over the processing gas supply mechanism main unit and an expanded diameter portion at which the nozzle portion is held with a gap may be formed at the gas outlet hole so as to open at the layering surface of the plate member at which it is layered over the processing gas supply mechanism main unit, in order to allow a gap formed between the nozzle portion and the expanded diameter portion to constitute the suction flow passage. The nozzle portion and the expanded diameter portion may each assume a shape whereby the diameter thereof becomes smaller further toward the downstream side.

It is also desirable that a void portion surrounding the open end of the expanded diameter portion opening at the plate member on the layering surface side and communicating with the upstream side of the suction flow passage be formed at the boundary of the processing gas supply mechanism main unit and the plate member. Such a void portion may be constituted with a recess formed with the layering surface of the plate member at the open end of the expanded diameter portion. The presence of the void portion ensures that the processing gas leaked to the boundary of the processing gas supply mechanism main unit and the plate member is collected and also allows the suction force to be generated in the suction flow passage with a higher level of reliability.

In addition, by forming the gas injection hole so that the hole diameter toward the downstream side is smaller than the hole diameter on the upstream side, the flow velocity of the processing gas injected through the injection opening can be increased, which, in turn, increases the suction force generated in the suction flow passage. Furthermore, a gas compression space may be formed between the downstream-side hole and the upstream-side hole so as to further increase the flow velocity of the processing gas injected through the injection opening, which, in turn, further increase the suction force generated in the suction flow passage.

The processing gas supply mechanism main unit may be constituted of metal and the plate member may be constituted of a silicon-containing material. In such case, since the coefficients of thermal expansion of the materials constituting the gas supply mechanism main unit and the plate member are different, a gap will readily be formed at the boundary of the processing gas supply mechanism main unit and the plate member as thermal expansion occurs. However, according to the present invention, characterized by processing gas supply holes through which the processing gas is supplied with the ejector effect, a processing gas leak into a gap formed due to thermal expansion at the boundary of the processing gas supply mechanism main unit and the plate member is prevented.

The object described above is also achieved in another aspect of the present invention by providing a processing gas supply mechanism that is disposed so as to face opposite a stage inside a processing chamber and supplies a processing gas toward a processing target substrate held on the stage comprising a processing gas delivery port through which the processing gas is delivered, a processing gas supply mechanism main unit having formed therein a diffusion chamber through which the processing gas delivered through the processing gas delivery port is diffused, a plate member layered over the processing gas supply mechanism main unit on a side thereof toward the stage and constituted of a material with a coefficient of thermal expansion different from the processing gas supply mechanism main unit, a middle member layered between the processing gas supply mechanism main unit and the plate member and constituted of a material different from the material constituting the processing gas supply mechanism main unit and a plurality of processing gas supply holes through which the processing gas is supplied into the processing chamber from the diffusion chamber. The processing gas supply holes are each constituted with a gas outlet hole formed at the plate member and a gas injection hole formed so as to range through the processing gas supply mechanism main unit and the middle member. The gas injection hole formed so that the processing gas flowing in from the diffusion chamber communicating with the gas injection hole on an upstream side thereof is injected toward the gas outlet hole from an injection opening at a nozzle portion disposed on a downstream side thereof. A suction flow passage with an upstream side thereof communicating with a boundary of the middle member and the plate member and a downstream side thereof connecting to the gas outlet hole is formed around the nozzle portion.

According to the present invention described above, as the processing gas having been delivered through the processing gas delivery port and diffused in the diffusion chamber flows into the gas injection hole at each processing gas supply hole, the processing gas is injected toward the gas outlet hole through the injection opening at the nozzle portion and a suction force, directed toward the downstream side gas outlet hole from the boundary of the upstream-side middle member and the plate member is created in the suction flow passage through the ejector effect whereby the injected processing gas is used as a driving flow. Thus, even if a gap is formed at the boundary of the middle member and the plate member due to thermal expansion or the like, the processing gas is not allowed to readily leak into the gap. In addition, since the quantity of heat transmitted to the processing gas supply mechanism main body can be minimized by layering the middle member between the processing gas supply mechanism main unit and the plate member, the extent of thermal expansion can be kept down.

In addition, the nozzle portion may be formed so as to project into the gas outlet hole through the layering surface of the middle member by machining the middle member and an expanded diameter portion at which the nozzle portion is held with a gap may be formed at the gas outlet hole so as to open at the layering surface of the plate member in order to allow a clearance formed between the nozzle portion and the expanded diameter portion to constitute the suction flow passage. The nozzle portion and the expanded diameter portion may each assume a shape whereby the diameter thereof becomes smaller further toward the downstream side.

It is also desirable that a void portion surrounding the open end of the expanded diameter portion opening at the plate member on the layering surface side and communicating with the upstream side of the suction flow passage, be formed at the boundary of the middle member and the plate member. Such a void portion may be constituted with a recess formed with the layering surface of the plate member at the open end of the expanded diameter portion. The presence of the void portion ensures that the processing gas leaked to the boundary of the processing gas supply mechanism main unit and the plate member is collected and also allows the suction force to be generated in the suction flow passage with a higher level of reliability.

In addition, by forming the gas injection hole so that the hole diameter toward the downstream side is smaller than the hole diameter on the upstream side, the flow velocity of the processing gas injected through the injection opening can be increased, which, in turn, increases the suction force generated in the suction flow passage. Furthermore, a gas compression states may be formed between the downstream-side hole and the upstream-side hole so as to further increase the flow velocity of the processing gas injected through the injection opening, which, in turn, will further increase the suction force in the suction flow passage.

The processing gas supply mechanism main unit may be constituted of metal and the plate member and the middle member may be constituted of a silicon-containing material. By forming the middle member where the nozzle portion is formed with a silicon-containing member as well, an abnormal electrical discharge that may otherwise be induced by the plasma generated inside the processing chamber in order to process the processing target substrate, is prevented.

It is desirable that a communicating passage connecting the boundary of the processing gas supply mechanism main unit and the middle member to the void portion, be formed at the middle member. The presence of such a communicating passage will prevent a processing gas leak at the boundary of the processing gas supply mechanism main unit and the middle member as well, and even if a leak should occur, the processing gas having leaked will be directed to travel through the communicating passage to be let out through the gas outlet hole from the void portion via the suction flow passage.

The object described above is achieved in another aspect of the present invention by providing a processing gas supply mechanism that is disposed so as to face opposite a stage inside a processing chamber and supplies a processing gas toward a processing target substrate held on the stage comprising a processing gas delivery port through which the processing gas is delivered, a processing gas supply mechanism main unit having formed therein a diffusion chamber through which the processing gas delivered through the processing gas delivery port is diffused, a plate member layered over the processing gas supply mechanism main unit on a side thereof toward the stage and constituted of a material with a coefficient of thermal expansion different from the processing gas supply mechanism main unit and a plurality of processing gas supply holes through which the processing gas is supplied into the processing chamber from the diffusion chamber. Among the plurality of processing gas supply holes, at least processing gas supply holes formed over an area further outward relative to an area facing opposite the processing target substrate placed on the stage are each constituted with a gas outlet hole formed at the plate member and a gas injection hole formed at the processing gas supply mechanism main unit with the gas injection hole formed so that the processing gas flowing in from the diffusion chamber communicating with the gas injection hole on an upstream side thereof is injected toward the gas outlet hole from an injection opening at a nozzle portion disposed on a downstream side thereof. A suction flow passage with an upstream side thereof communicating with a boundary of the gas supply mechanism main unit and the plate member and a downstream side thereof connecting to the gas outlet hole, is formed around the nozzle portion.

According to the present invention described above, even if a gap is formed at the boundary of the processing gas supply mechanism main unit and the electrode plate and the processing gas leaks through the processing gas supply holes formed over the area facing opposite the processing target substrate, the processing gas having leaked can be let out through the processing gas supply holes formed further outward relative to the area facing opposite the processing target substrate by taking advantage of the ejector effect.

According to the present invention, even when the processing gas supply mechanism with processing gas supply holes formed to range over a plurality of members layered one on top of another thermally expands and a gap is formed between the members, the processing gas is not allowed to readily leak into the gap. In addition, even if a processing gas leak should occur, the leaked processing gas is sucked through the ejector effect and is then let out through the processing gas supply holes.

DETAILED DESCRIPTION OF THE PREFERRED EMBODIMENTS

Figure 1:
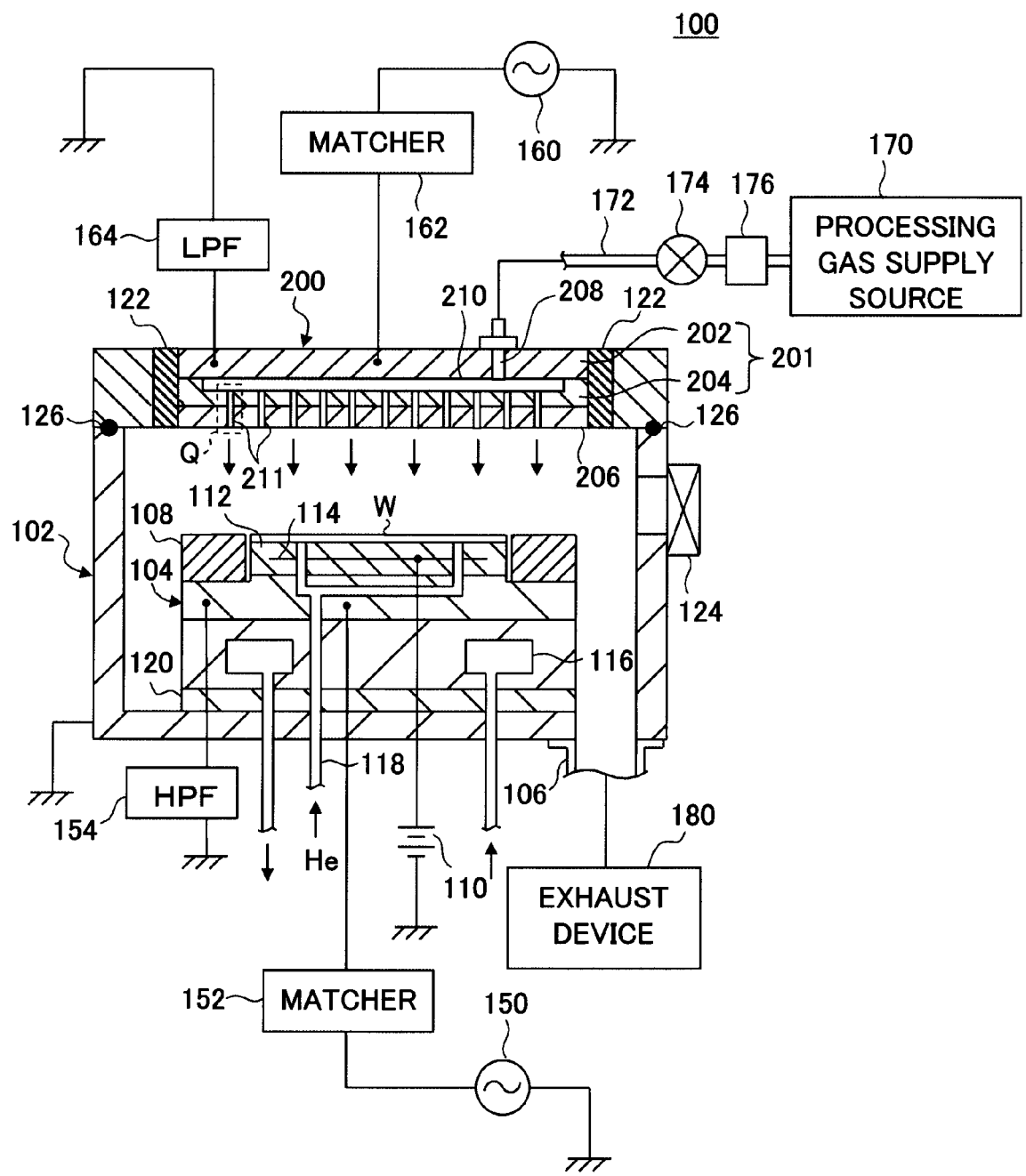
FIG. 1 is a sectional view of a structural example of a plasma processing apparatus adopting the processing gas supply mechanism achieved in a first embodiment of the present invention in an upper electrode thereof.

The following is a detailed explanation of the preferred embodiments of the present invention, given in reference to the attached drawings. It is to be noted that in the specification and drawings, the same reference numerals are assigned to components having substantially identical functions and structural features to preclude the necessity for a repeated explanation thereof.

(Substrate Processing Apparatus)

A substrate processing apparatus that may adopt the processing gas supply mechanism achieved in the first embodiment of the present invention is now described. The explanation is given by assuming that the substrate processing apparatus is a plane-parallel plasma processing apparatus having an upper electrode and a lower electrode (susceptor) disposed to face opposite each other inside a processing chamber with a processing gas supplied into the processing chamber through the upper electrode and that the processing gas supply mechanism according to the present invention is adopted in the upper electrode. FIG. 1 schematically illustrates the structure of the plasma processing apparatus achieved in the embodiment in a sectional view. It is to be noted that in order to simplify the illustration, FIG. 1 shows a smaller number of processing gas supply holes 211 than the number of processing gas supply holes that are actually formed.

The plasma processing apparatus 100 includes a processing chamber 102 constituted of an electrically conductive material such as aluminum, a lower electrode (susceptor) 104 that is disposed at the bottom surface inside the processing chamber 102 and also functions as a stage on which a wafer W, i.e., the processing target substrate, is placed and an upper electrode 200 that is disposed parallel to the lower electrode 104 so as to face opposite the lower electrode and also functions as a gas supply mechanism.

A first high-frequency power source 150 is connected to the lower electrode 104 via a matcher 152, whereas a second high-frequency power source 160 capable of outputting power with a higher frequency than the first high-frequency power source 150 is connected to the upper electrode 200 via a matcher 162. In addition, a high pass filter 154 is connected to the lower electrode 104 and a low pass filter 164 is connected to the upper electrode 200.

A focus ring 108 is disposed along the outer edge of the upper surface of the lower electrode 104 so as to enclose the wafer W along its outer edge. Plasma is caused to converge on the wafer W by the focus ring 108. An electrostatic chuck 112 connected to a high-voltage DC power source 110 is disposed at the upper surface of the lower electrode 104 and the wafer W can be held fast to the electrostatic chuck 112 with the electrostatic clamping force induced as a high DC voltage originating from the high-voltage DC power source 110 is applied to an electrode 114 disposed within the electrostatic chuck 112.

A built-in temperature adjustment mechanism 116 is installed within the lower electrode 104 for purposes of temperature adjustment, and the temperature of the wafer W can be thus adjusted to a predetermined level via the temperature adjustment mechanism 116. The temperature adjustment mechanism 116 adjusts the temperature of the lower electrode 104 with, for instance, a coolant circulated through a coolant chamber formed inside the lower electrode 104.

In addition, a gas passage 118, through which a heat transfer medium (e.g., He gas) is distributed, is formed inside the lower electrode 104 so as to open at a plurality of positions at the upper surface of the lower electrode. Holes are formed at the electrostatic chuck 112 in correspondence to the openings of the gas passage 118, thereby allowing the He gas to be delivered into the narrow gap between the wafer W and the electrostatic chuck 112. Through these measures, the process of heat transfer between the lower electrode 104 and the wafer W is actively promoted.

An insulating plate 120 is disposed between the lower surface of the lower electrode 104 and the bottom surface of the processing chamber 102 and thus, the lower electrode 104 and the processing chamber 102 are insulated from each other. It is to be noted that a bellows constituted of, for instance, aluminum may be disposed between the insulating plate and the bottom surface of the processing chamber 102 so as to allow the lower electrode 104 to move up/down via an elevator mechanism (not shown). The structure described above allows the distance between the upper electrode 200 and the lower electrode 104 to be adjusted to an optimal value in correspondence to the specific type of plasma processing to be executed.

A exhaust port 106 is formed at the bottom surface of the processing chamber 102 and as the gas inside the processing chamber is discharged via an exhaust device 180 connected to the exhaust port 106, the inside of the processing chamber 102 can be sustained at a predetermined level of low pressure.

(Structural Example for the Upper Electrode Functioning as a Gas Supply Mechanism)

A processing gas supply source 170 is connected via a gas supply pipe 172 to the upper electrode 200 functioning as the gas supply mechanism. A processing gas (e.g., a fluorocarbon gas ($C_XF_Y$) used as an etching gas) a cleaning gas (e.g., $O_2$ gas) or the like is supplied from the processing gas supply source 170. A valve 174 and a mass flow controller 176 are disposed at the gas supply pipe 172 and, the flow rate of the processing gas or the cleaning gas is adjusted via the valve 174 and the mass flow controller 176.

It is to be noted that while FIG. 1 shows a single processing gas supply system constituted with the processing gas supply source 170, the gas supply pipe 172, the valve 174 and the mass flow controller 176, the plasma processing apparatus 100 actually includes a plurality of processing gas supply systems. Gases such as $CF_4$, $O_2$, $N_2$ and $CHF_3$ are supplied into the processing chamber 102 with the gas flow rates controlled independently of one another.

The upper electrode is mounted at the ceiling of the processing chamber 102 via a shield ring 122 covering the peripheral edge thereof. In addition, a gate valve 124 is disposed at the sidewall of the processing chamber 102. As the gate valve 124 opens, the wafer W can be carried into or out of the processing chamber 102. The ceiling at which the upper electrode 200 is mounted is a lid portion that can be opened, with a seal member 126 such as an o-ring disposed between the lid portion and the sidewall so as to assure airtightness.

The upper electrode 200 is constituted with a processing gas supply mechanism main unit 201 and a plate member provided in the form of an electrode plate 206, which is layered on the processing gas supply mechanism main unit 201 on its lower side so as to face opposite the lower electrode (susceptor) 104. The processing gas supply mechanism main unit 201 includes an upper member 202 and a cooling plate 204, which are layered in this order starting from the top. Namely, the upper electrode 200 in the embodiment assumes a three-layer structure achieved by layering the upper member 202, the cooling plate 204 and the electrode plate 206. The upper member 202, the cooling plate 204 and the electrode plate 206 are detachably held together via fastening means (not shown) such as bolts and nuts. It is to be noted that the upper member 202 and the cooling plate 204 in the processing gas supply mechanism main unit 201 may be formed as an integrated unit.

The electrode plate 206 is constituted of a material with a coefficient of thermal expansion different from that of the material constituting the processing gas supply mechanism main unit 201, which supports the electrode plate. More specifically, while the processing gas supply mechanism main unit 201 may be constituted of a metal such as aluminum, the electrode plate 206 may be constituted of a silicon-containing material such as quartz ($SiO_2$), SiC or SiN.

A processing gas delivery port 208 through which the processing gas from the gas supply pipe 172 is delivered is formed at the processing gas supply mechanism main unit 201. A diffusion chamber 210, where the processing gas delivered through the processing gas delivery port 208 is diffused is located inside the processing gas supply mechanism main unit 201. In more specific terms, the processing gas delivery port 208 is formed at the top of the upper member 202 so as to pass through to the diffusion chamber 210 as shown in FIG. 1. A circular recess (e.g., a counter-bore) is formed at the surface of, for instance, the cooling plate 204 at which it is joined with the upper member 202, and the diffusion chamber 210 is constituted with the space formed as the cooling plate 204 and the upper member 202 are joined together.

It is to be noted that the diffusion chamber 210 may adopt a structure other than that described above. For instance, instead of forming a recess at the surface of the cooling plate 204 at which the cooling plate is joined with the upper member 202, a recess may be formed at the surface of the upper member 202 at which the upper member is joined to the cooling plate 204, or a recess may be formed at both the cooling plate 204 and the upper member 202.

Processing gas supply holes 211 through which the processing gas traveling from the diffusion chamber 210 is supplied into the processing chamber 102 are formed so as to range through the cooling plate 204 and the electrode plate 206. Through the processing gas supply holes 211, which are formed in a great number, the processing gas can be supplied over the entire surface of the wafer W placed on the lower electrode 104. It is to be noted that specific structural examples that may be adopted in embodiments of the processing gas supply holes 211 are to be described in detail later.

Although not shown, a cooling mechanism that cools the upper electrode 200 is installed in the processing gas supply mechanism main unit 201. More specifically, a chiller flow passage (not shown) may be formed at the cooling plate 204 at a specific position outside the diffusion chamber 210 so as to adjust (lower) the temperature of the electrode plate 206 by circulating a coolant with the temperature thereof adjusted through the chiller flow passage.

As the processing gas from the processing gas supply source 170 is supplied to the upper electrode 200 equipped with the processing gas supply mechanism described above, the processing gas is delivered into the diffusion chamber 210 via the gas supply pipe 172 and the processing gas delivery port 208, becomes diffused in the diffusion chamber to be distributed toward the various processing gas supply holes 211, and is let out toward the lower electrode 104 inside the processing chamber 104 through the processing gas supply holes 211.

In the plasma processing apparatus 100 structured as described above, a silicon oxide film, a silicon nitride film, a polysilicon film or the like, formed on the wafer W is dry etched by using a processing gas normally constituted with a fluorine-containing gas such as $CF_4$ or $CHF_3$. As the processing gas is supplied into the processing chamber 102 via the upper electrode 200 and high-frequency power with a frequency of, for instance, 60 MHz is applied from the second high-frequency power source 160 to the upper electrode 200, the processing gas is raised to plasma in the space between the upper electrode 200 and the lower electrode 104. When a predetermined length of time, e.g., 1 sec elapses, biasing high-frequency power with a frequency of, for instance, 2 MHz, is applied to the lower electrode 104 from the first high-frequency power source 150. As a result, the specific type of film formed on the wafer W becomes etched with the plasma.

(Thermal Expansion of the Cooling Plate and the Electrode Plate)

As plasma is generated inside the processing chamber 102 at the plasma processing apparatus 100, the temperature of the upper electrode 200 increases due to heat input from the plasma. In addition, as the lower electrode 104 is heated by the temperature adjustment mechanism 116, the heat radiated from the lower electrode raises the temperature of the upper electrode 200 as well. Such an increase in the temperature of the upper electrode causes thermal expansion of both the processing gas supply mechanism main unit 201 and the electrode plate 206 constituting the upper electrode 200.

Since the processing gas supply mechanism main unit 201 and the electrode plate 206 are constituted of materials with different coefficients of thermal expansion, the processing gas supply mechanism main unit 201 and the electrode plate 206 thermally expand to different extents. For instance, if the processing gas supply mechanism main unit 201 is constituted of aluminum and the electrode plate 206 is constituted of quartz, the processing gas supply mechanism main unit 201 will thermally expand to a greater extent along the lateral direction than the electrode plate 206, since the coefficient of thermal expansion of aluminum is greater than the coefficient of thermal expansion of quartz.

However, since the upper electrode 200 is surrounded by the shield ring 122 disposed along the edge thereof, the thermal expansion of the processing gas supply mechanism main unit 201 along the horizontal direction is restricted by the shield ring 122, causing the processing gas supply mechanism main unit to start warping slightly ahead of the electrode plate 206 as the process of thermal expansion progresses. Such a slight extent of warping creates a small gap between the processing gas supply mechanism main unit 201 and the electrode plate 206. Under such circumstances, some of the processing gas flowing through the processing gas supply holes 211 may leak through the gap 25.

Accordingly, a special structure is adopted in the processing gas supply holes 211 in the processing gas supply mechanism in the embodiment so as to ensure that even when a gap is formed between the processing gas supply mechanism main unit 201 and the electrode plate 206, the processing gas does not leak into the gap.

(Structural Examples for the Processing Gas Supply Holes)

Figure 2:
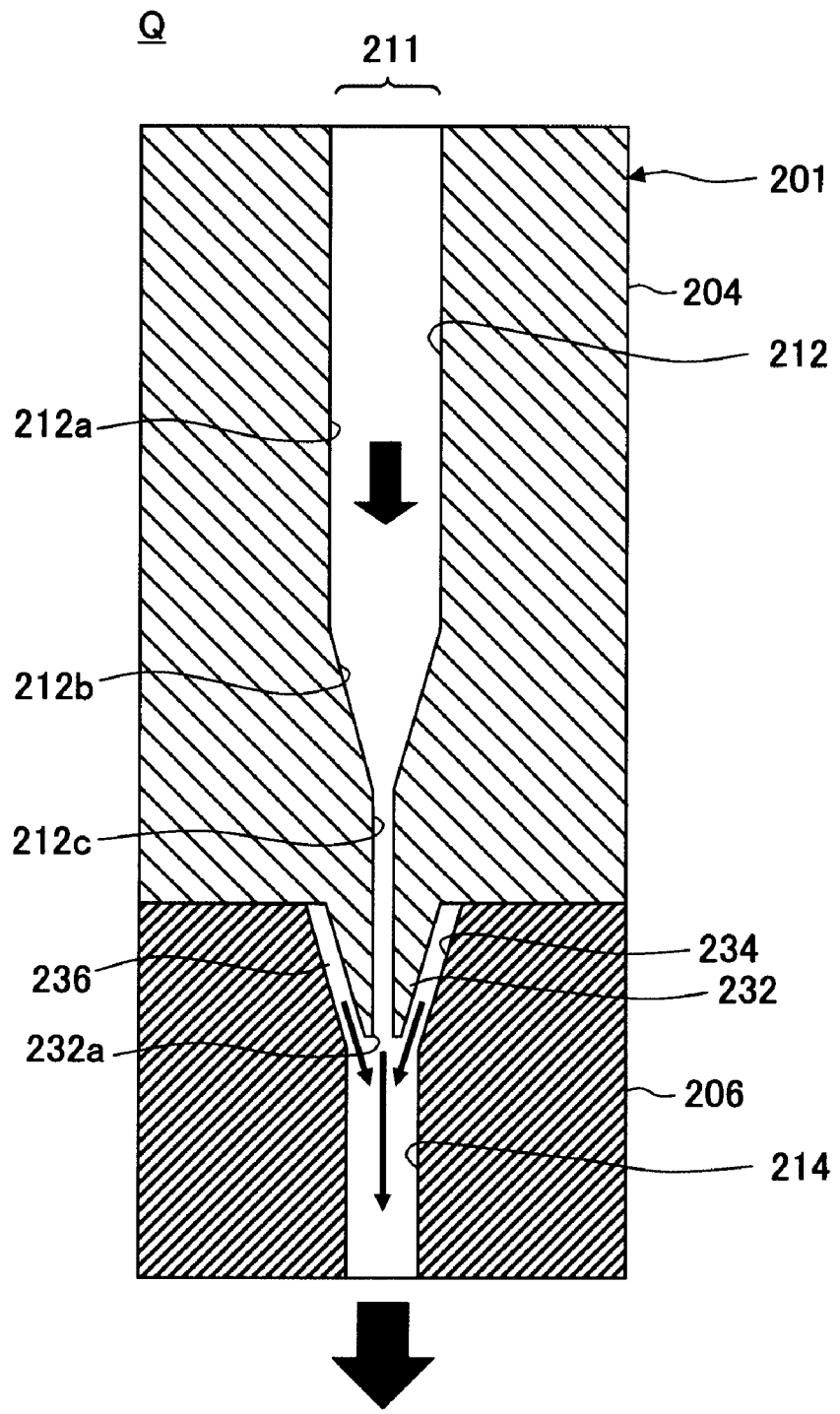
FIG. 2 illustrates the structure adopted in the processing gas supply holes in the embodiment in a sectional view, showing in an enlargement an area Q over which one of the processing gas supply holes in FIG. 1 is formed.

Structural example that may be adopted for the processing gas supply holes 211 in the upper electrode 200 equipped with the processing gas supply mechanism achieved in the embodiment are now explained in reference to drawings. FIG. 2 illustrates a structure that may be adopted in the processing gas supply holes in the embodiment in a sectional view, showing, in an enlargement, an area Q over which one of the processing gas supply holes in FIG. 1 is formed. As shown in FIG. 2, the processing gas supply holes 211 are each constituted with a gas outlet hole 214 passing through the plate member provided in the form of the electrode plate 206 and a gas injection hole (driving flow passage) 212 formed at the cooling plate 204 in the processing gas supply mechanism main unit 201.

The gas injection hole 212 is formed so that the processing gas flowing in from the diffusion chamber 210 communicating with the upstream side of the gas injection hole is injected toward the gas outlet hole 214 from an injection opening 232a at a nozzle portion 232 disposed on the downstream side of the gas injection hole. More specifically, the gas injection hole 212 is formed as shown in FIG. 2, with a large diameter portion 212a with a uniform large diameter, a tapered portion 212b over which the diameter gradually decreases, and a small diameter portion 212c with a uniform small diameter ranging in sequence contiguously from the upstream side toward the downstream side.

The small diameter portion 212c, located on the downstream side of the gas injection hole 212, is formed to range over the nozzle portions 232 with the injection opening 232a of the gas injection hole 212 opening at the front end of the nozzle portion 232. The nozzle portions 232 is formed so as to project out from the layering surface of the cooling plate 204 (the surface at which the cooling plate joins the electrode plate 206) into the gas outlet hole 214 located under the layering surface by, for instance, machining the layering surface of the cooling plate 204.

By forming the gas injection hole 212 so that the hole diameter on the upstream side (e.g., the diameter at the large diameter portion 212a) is greater than the hole diameter on the downstream side (e.g., the diameter at the small diameter portion 212c) as described above, the flow velocity of the processing gas having flowed in from the upstream side of the gas injection hole 212 is increased on the downstream side before it is injected toward the gas outlet hole 214.

The gas outlet hole 214 assumes a diameter greater than the diameter of the small diameter portion 212c of the gas injection hole 212 (equal to the diameter of the injection opening 232a). In addition, an expanded diameter portion 234 at which the nozzle portions 232 is held with a gap is formed at the gas outlet hole 214 so that the expanded diameter portion opens at the layering surface of the electrode plate 206 (the surface of the electrode plate at which the electrode plate joins the cooling plate 204. As a result, a gap that is to constitute a suction flow passage 236, is formed on the outside of the nozzle portions 232 and on the inside of the expanded diameter portion 234. The suction flow passage 236 with the upstream side thereof communicating with the boundary of the cooling plate 204 and the electrode plate 206 and the downstream side thereof connecting to the gas outlet hole 214 is thus formed around the nozzle portion 232.

The size and shape of the suction flow passage 236 are determined in correspondence to the shape of the exterior of the nozzle portions 232 and the shape of the interior of the expanded diameter portion 234. Accordingly, it is desirable to design their shapes by taking into consideration the level and the like of the suction force to be generated in the suction flow passage 236. By designing them in, for instance, identical shapes, a suction flow passage 236 assuming a uniform shape can be formed around the nozzle portion 232. FIG. 2 shows the nozzle portions 232 and the expanded diameter portion 234 respectively assuming a tapered exterior shape and a tapered interior shape, the diameter of each of which becomes gradually smaller from the upstream side toward the downstream side.

It is to be noted that since the velocity energy of the processing gas is converted to a pressure energy at the gas outlet hole 214 with a diameter greater than the diameter of the injection opening 232a, the pressure of the processing gas to be let out into the processing chamber 102 from the gas outlet hole 214 can be controlled by adjusting the diameter of the gas outlet hole 214.

In reference to FIG. 2, the action occurring at each of such processing gas supply holes 211 is explained below. For instance, part of the processing gas diffused along the horizontal direction in the diffusion chamber 210, which is distributed into processing gas supply holes 211, invariably travels through the gas injection hole 212. In other words, the processing gas travels from the large diameter portion 212a through the tapered portion 212b to flow into the small diameter portion 212c at the gas injection hole 212. During this process, the pressure energy of the processing gas passing through the tapered portion 212b is converted to velocity energy and, as a result, the processing gas is bound to flow through the small diameter portion 212c at a higher velocity than the processing gas flowing through the large diameter portion 212a.

The processing gas with the higher flow velocity is then injected toward the gas outlet hole 214 through the injection opening 232a formed at the front end of the nozzle portion 232. Since this lowers the pressure on the downstream side in the suction flow passage 236 relative to the pressure on the upstream side, a suction force directed downward in the figure, which is applied toward the gas outlet hole 214 on the downstream side from the boundary of the cooling plate 204 and the electrode plate 206 located on the upstream side, is generated in the suction flow passage 236.

Thus, even if a gap is formed at the boundary of the cooling plate 204 and the electrode plate 206 due to thermal expansion or the like, a processing gas leak into the gap from the injection opening 232a is prevented. In addition, even if a leak occurs, the processing gas having leaked creates a suction flow traveling through the suction flow passage 236 to flow into the gas outlet hole 214 where it joins the processing gas injected through the injection openings 232a and thus, the leaked processing gas, too, is let out into the processing chamber 102 through the gas outlet hole.

As described above, through the processing gas supply hole achieved in the embodiment, a suction force directed toward the gas outlet hole 214 from the boundary of the cooling plate 204 and the electrode plate 206 can be generated in the suction flow passage 236 through the guiding effect (ejector effect) whereby the flow of the processing gas injected through the injection opening 232a is used as a driving flow.

The processing gas supply hole structure designed by taking advantage of the ejector effect as described above is adopted in all the processing gas supply holes 211 at the upper electrode 200 such as that shown in FIG. 1. As the processing gas from the diffusion chamber 210 flows into the gas injection holes 212 at the individual processing gas supply holes 211 structured as described above, all the processing gas having flowed into the gas injection holes 212 can be let out into the processing chamber 102 through the corresponding gas outlet holes 214 without being allowed to leak into a gap that may have been formed at the boundary of the cooling plate 204 and the electrode plate 206 due to thermal expansion.

In addition, since the processing gas at a given gas supply hole is not leaked through the boundary of the cooling plate 204 and the electrode plate 206 to enter the gas outlet hole 214 at another processing gas supply hole, the processing gas, having entered the particular gas supply hole, can be let out in its entirety through the gas outlet hole 214 therein. This means that even when thermal expansion of the upper electrode 200 occurs, the processing gas can be let out through all the processing gas supply holes 211 at the expected specific flow rate at all times, enabling desired processing to be executed over the entire surface of the wafer W.

Furthermore, the nozzle portions 232 at the cooling plate 234 are each inserted with a gap at an expanded diameter portion 234 in the electrode plate 206. Thus, even if a horizontal misalignment occurs with respect to the positions of the cooling plate 204 and the electrode plate 206 due to thermal expansion, the positional misalignment manifested by the nozzle portions 232 and the expanded diameter portion 234 relative to each other can be absorbed by an extent corresponding to the clearance formed between the nozzle portions 232 and the expanded diameter portion 234. Consequently, the processing gas can always be injected through the gas injection hole 212 toward the gas outlet hole 214.

It is to be noted that the nozzle portions 232, formed by machining the cooling plate 204, are constituted of the same material as that constituting the cooling plate 204, i.e., a metal such as aluminum. For this reason, it is conceivable that an abnormal electrical discharge may occur at the front ends of the nozzle portions 232 during the plasma processing. However, such an abnormal electrical discharge can be prevented by adjusting the thickness of the electrode plate 206 to a large value.

In addition, a void portion communicating with the suction flow passage 236 may be formed at the boundary of the cooling plate 204 and the electrode plate 206 in the processing gas supply mechanism main unit 201, so as to allow the processing gas having leaked into the boundary of the cooling plate 204 and the electrode plate 206 to flow into the suction flow passage 236 with ease.

Figure 3:
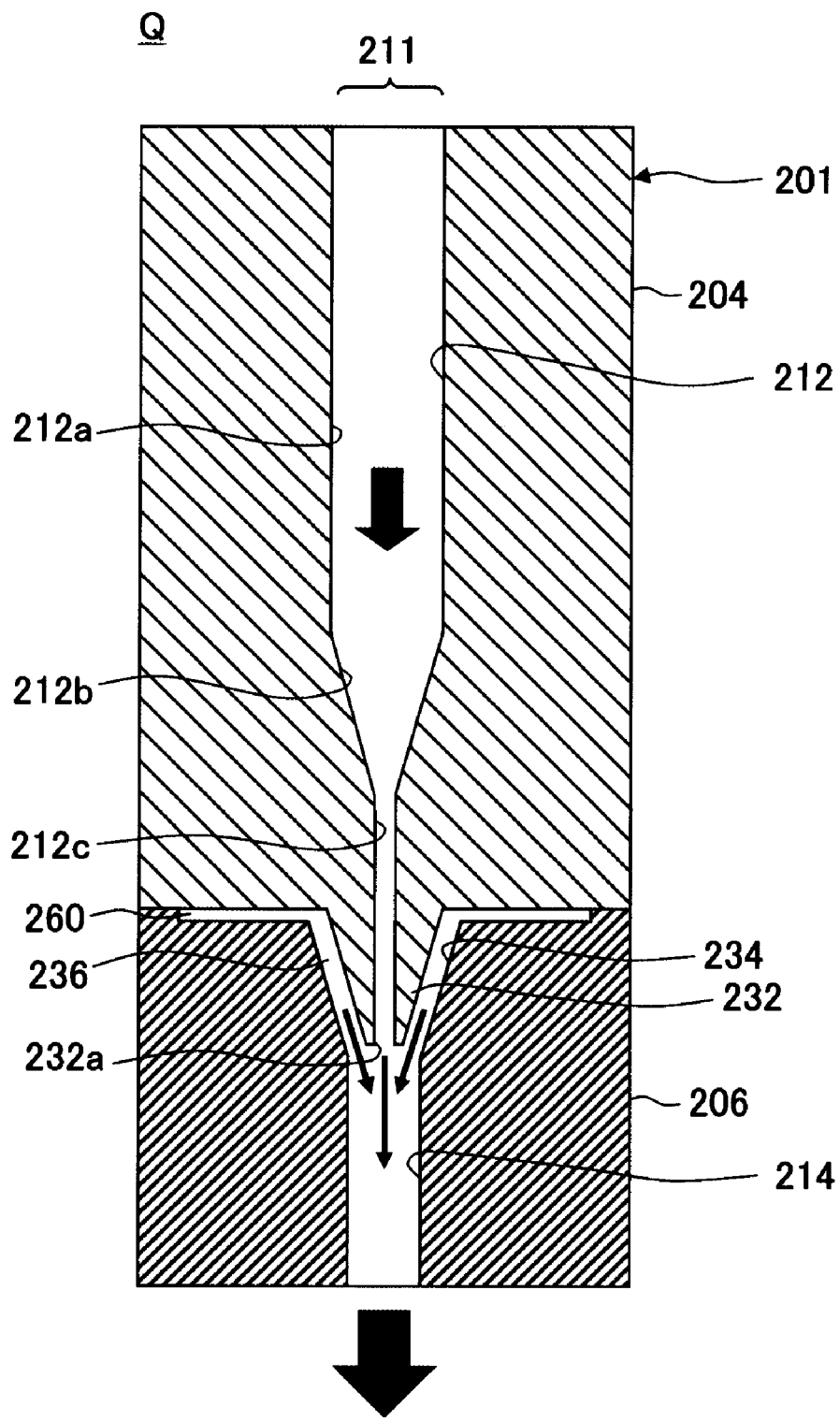
FIG. 3 is a sectional view illustrating a structure that may be adopted in the processing gas supply holes in a variation of the embodiment.

For instance, a void portion 260 may be formed at the layering surface of the electrode plate 206 (the surface of the electrode plate at which it joins the cooling plate 204), as shown in FIG. 3. More specifically, the void portion 260 may be created on the upper side of the expanded diameter portion 234 at each gas outlet hole 214 by forming a recess (e.g., a counter-bore) at the upper surface of the electrode plate 206. Such a void portion 260 is formed so as to surround the periphery of the open end of the expanded diameter portion 234 opening on the layering surface side of the electrode plate 206 and to communicate with the upstream side of the suction flow passage 236.

The processing gas having leaked into the boundary of the cooling plate 204 and the electrode plate 206 will readily flow into the void portion 260 formed as described above and the suction force generated with the ejector effect will facilitate its flow into the suction flow passage 236. As a result, the processing gas will be reliably guided into the gas outlet hole 214.

In addition, by adjusting the size or the shape of the void portion 260 formed at the boundary of the cooling plate 204 and the electrode plate 206 so as to communicate with the suction flow passage 236, the pressure difference between the pressure in the void portion 260 located on the upstream side of the suction flow passage 236 and the pressure around the gas injection hole 212 located on the downstream side can be controlled. Through these measures, the suction force directed through the suction flow passage 236 toward the gas outlet hole 214 from the boundary of the cooling plate 204 and the electrode plate 206 can be generated even more reliably.

(Processing Gas Supply Holes Achieved in the Second Embodiment)

Figure 4:
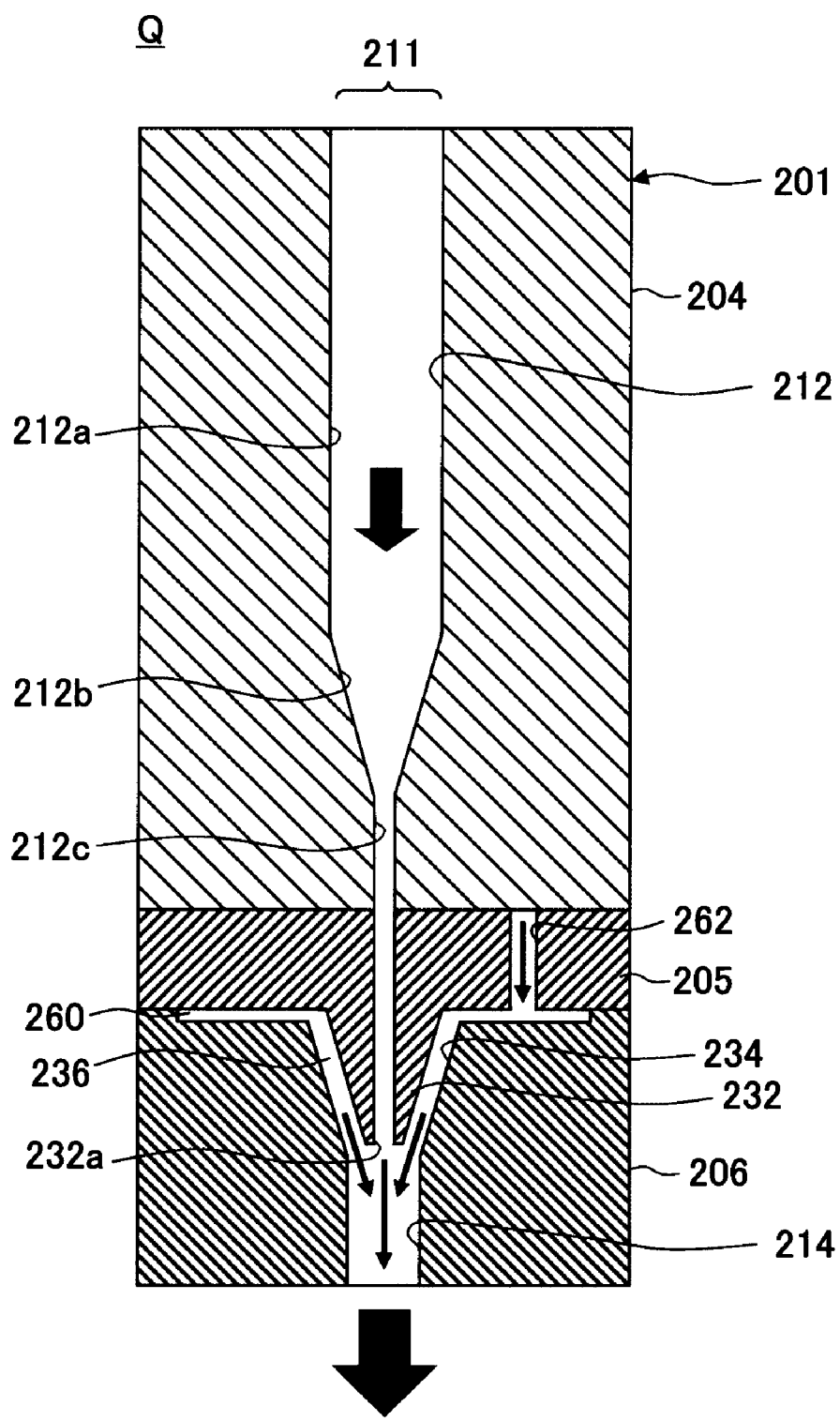
FIG. 4 illustrates the structure adopted in the processing gas supply holes in a second embodiment of the present invention in a sectional view.

Next, the processing gas supply holes achieved in the second embodiment of the present invention are described in reference to a drawing. FIG. 4 illustrates the structure adopted in the processing gas supply holes in the embodiment, in an enlargement of an area Q over which one of processing gas supply holes in FIG. 1 is formed. The processing gas supply holes 211 in the second embodiment are each formed by layering a plate-like middle member 205 constituted of a material that inhibits heat input and an abnormal electrical discharge attributable to plasma and heat radiation, between the processing gas supply mechanism main unit 201 and the electrode plate 206 shown in FIG. 3, with nozzle portions 232 formed at the middle member 205. It is to be noted that in FIG. 4, the same reference numerals are assigned to parts having functions similar to those in FIG. 3 so as to preclude the necessity for a detailed explanation thereof.

The middle member 205 in FIG. 4 is detachably held via a fastening means (not shown) such as nut and bolt, between the cooling plate 204 constituting the lower layer of the processing gas supply mechanism main unit 201 and the electrode plate 206. The middle member 205 is constituted of a material that inhibits the heat input and the abnormal electrical discharge attributable to plasma or heat radiation, e.g., a silicon-containing material such as quartz ($SiO_2$), SiC or SiN. The middle member 205 may be formed by using the same material as that used to constitute the electrode plate 206 or it may be formed by using a different material.

Since the processing gas may conceivably leak into the boundary of the middle member 205 and the electrode plate 206 shown in FIG. 4, a void portion 260 similar to that shown in FIG. 3 is formed at the boundary of the middle member 205 and the electrode plate 206.

Furthermore, since the processing gas may conceivably leak into the boundary of the middle member 205 and the cooling plate 204 in the structure shown in FIG. 4, a communicating hole 262, which communicates the boundary of the middle member 205 and the cooling plate 204 with the void portion 260, is formed at the middle member 205. As a result, as the processing gas is injected toward the gas outlet hole 214 through the injection opening 232a, a suction force directed toward the gas outlet hole 214 via the communicating hole 262, the void portion 260 and the suction flow passage 236 is also generated at the boundary of the middle member 205 and the cooling plate 204. It is to be noted that a through hole, which constitutes part of the small diameter portion 212c of the gas injection hole 212 (the part ranging from the upper side surface of the middle member 205 to the injection opening 232a of the nozzle portion 232) is formed at the middle member 205 in FIG. 4.

In the second embodiment described above, the middle member 205 constituted of a material that inhibits heat input from plasma or radiation, e.g., quartz, is disposed between the cooling plate 204 and the electrode plate 206, so as to minimize the quantity of heat transferred to the processing gas supply mechanism main unit 201 from plasma or the like. Since this limits the extent of thermal expansion of the processing gas supply mechanism main unit 201, it can be assured that there is hardly any difference between the extent to which the processing gas supply mechanism main unit 201 becomes thermally expanded and the extent to which the middle member 205 becomes thermal expanded. Consequently, the formation of the gap between the middle member 205 and the cooling plate 204 of the processing gas supply mechanism main unit 201, which comes into contact with the middle member, can be inhibited.

In addition, by disposing the middle member 205 constituted of a material that inhibits abnormal electrical discharge, such as quartz, between the cooling plate 204 and the electrode plate 206 and forming the nozzle portions 232 at the middle member 205, the occurrence of abnormal electrical discharge can be inhibited more effectively, compared to the abnormal electrical discharge inhibiting effect that may be achieved by forming the nozzle portions 232 with a metal such as aluminum.

While hardly any difference manifests with regard to the extents of thermal expansion as long as the middle member 205 is constituted of the same material as that constituting the electrode plate 206, a gap may be formed between the middle member 205 and the electrode plate 206 constituted of materials with varying coefficients of thermal expansion due to the varying extents to which they become thermally expanded. Even under such circumstances, as the processing gas is injected through the injection opening 232a toward the gas outlet hole 214, as in the situation illustrated in FIG. 3, the pressure around the injection opening 232a becomes lower and thus a suction force directed from the suction flow passage 236 toward the gas outlet hole 214 is generated at the void portion 260 formed over the boundary of the middle member 205 and the electrode plate 206 in the second embodiment. As a result, the processing gas leaked into the void portion 260 can be guided toward the gas outlet hole 214 via the suction flow passage 236.

While the presence of the middle member 205 inhibits thermal expansion of the cooling plate 204, the processing gas may conceivably leak into the boundary of the cooling plate 204 and the middle member 205 in the structure illustrated in FIG. 4. Even if such a leak should occur, the processing gas leaked into the boundary of the middle member 205 and the cooling plate 204 as the processing gas is injected through the injection opening 232a toward the gas outlet hole 214 can be guided into the gas outlet hole 214 via the communicating hole 262, the void portion 260 and the suction flow passage 236 in the second embodiment.

In the second embodiment described above, the processing gas leak into the boundary of the processing gas supply mechanism main unit 201 and the middle member 205, as well as the processing gas leak into the boundary of the middle member 205 and the electrode plate 206, can be inhibited effectively.

It is to be noted that while an explanation is given above in reference to the second embodiment on an example in which the gas injection holes 212 are each constituted with the large diameter portion 212a, the tapered portion 212b and the small diameter portion 212c, the present invention is not limited to this example and the flow velocity of the processing gas injected through the injection opening 232a may be further raised via a gas compression space formed at a position immediately preceding the small diameter portion 212c.

Figure 5:
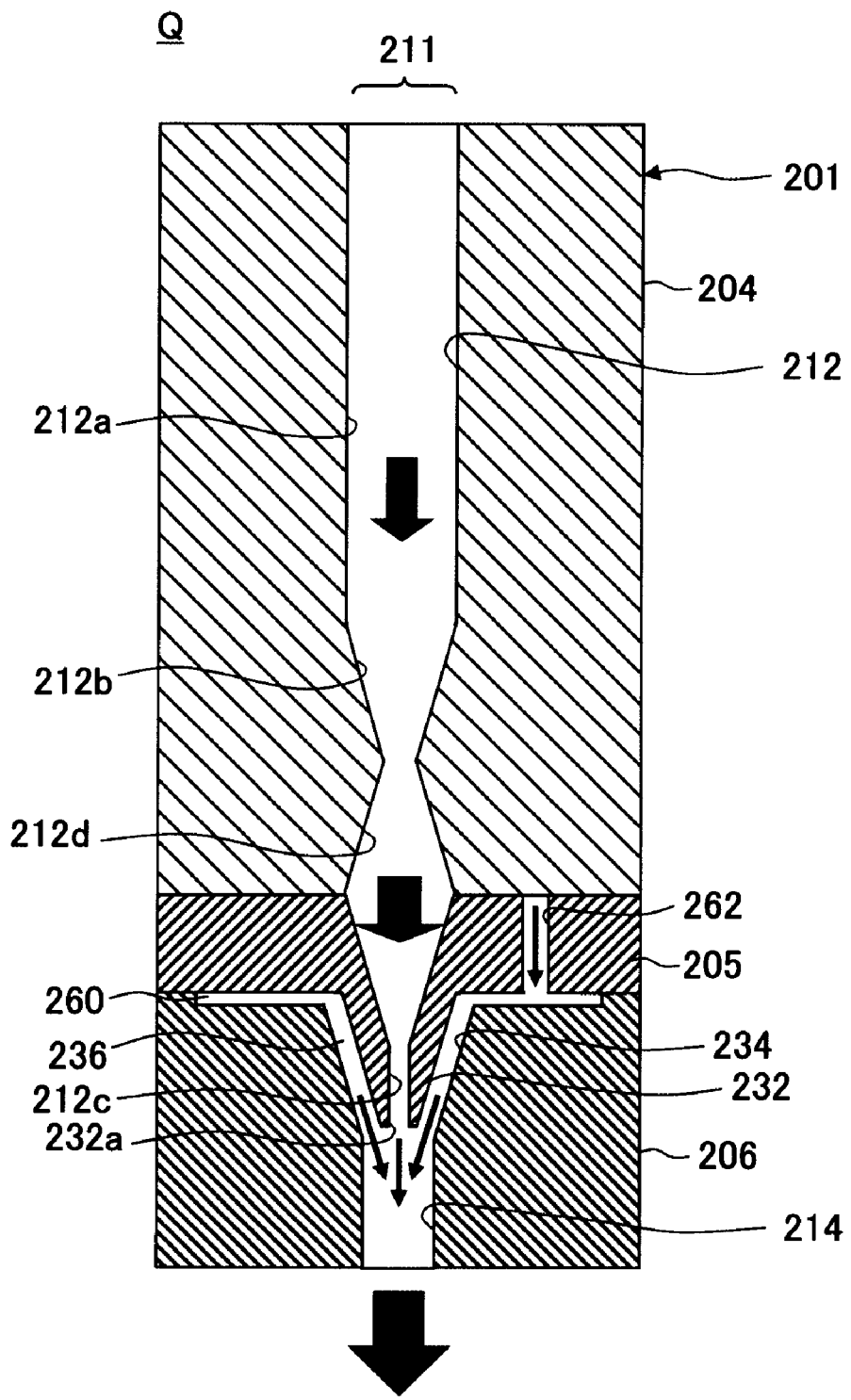
FIG. 5 is a sectional view illustrating a structure that may be adopted in the processing gas supply holes in a variation of the embodiment.

More specifically, a gas compression space 212d may be formed between the tapered portion 212b and the small diameter portion 212c as shown in FIG. 5. This gas compression space 212d may assume a shape achieved by forming a tapered portion with a gradually increasing diameter and a tapered portion with a gradually decreasing diameter continuous to each other, as shown in FIG. 5, with the tapered portion 212b, the gas compression space 212d and the small diameter portion 212c connecting with each other in this order. The tapered portion of the gas compression space 212d with the gradually increasing diameter should be formed, for instance, over the lower surface of the cooling plate 204 and the tapered portion of the gas compression space with the gradually decreasing diameter should be formed over the upper surface of the middle member 205 as shown in FIG. 5. Since the middle member 205 is disposed between the cooling plate 204 and the electrode plate 206, the gas compression space 212d can be formed with ease at the position immediately preceding the small diameter portion 212c in the embodiment.

The processing gas having flowed into the large diameter portion 212a of the gas injection hole 212 structured as described above increases its flow velocity as it travels through the tapered portion 212b and becomes compressed in the gas compression space 212d. As a result, the processing gas in a high-pressure state flows into the small diameter portion 212c, which, in turn, allows the processing gas to be injected at high speed through the injection opening 232a located at the tip of the small diameter portion 212c. By raising the flow velocity of the processing gas injected through the injection opening 232a as described above, the level of the suction force generated in the suction flow passage 236 can be increased and, as a result, the leaked processing gas can be suctioned more efficiently. Moreover, the flow velocity of the processing gas which is ultimately let out through the gas outlet hole 214, too, can be raised to a higher level.

In addition, since the gas compression space 212d is formed so as to range astride the cooling plate 204 and the middle member 205, the gas injection hole 212 and the gas outlet hole 214 can sustain a state of communication with each other even if thermal expansion should result in a misalignment manifested by the cooling plate 204 and the middle member 205 along the horizontal direction. While the processing gas may more readily leak into the boundary of the cooling plate 204 and the middle member 205 under such circumstances, the leaked processing gas can be guided through the communicating hole 262 connected with the boundary of the cooling plate 204 and the middle member 205 to be let out into the processing chamber 102 through the gas outlet hole 214 with a high level of reliability with the suction force directed toward the void portion 260 and the suction flow passage 236. Consequently, regardless of whether or not thermal expansion occurs, the processing gas can be let out smoothly into the processing chamber 102 through each of the processing gas supply holes 211.

It is to be noted that the gas compression space 212d may be formed at a position immediately preceding the injection opening 232a at each of the gas injection holes 212 in the first embodiment having been described in reference to FIGS. 2 and 3. In such a case, the flow velocity of the processing gas injected through the injection opening 232a can be increased to a higher level at the gas injection holes 212 shown in FIGS. 2 and 3, as well.

As described above, at each of the processing gas supply holes 211 at the upper electrode 200 achieved in the first and second embodiments, a suction flow passage 236 extending from the boundary with the electrode plate 206 toward the injection opening 232a is formed, and thus, the processing gas having flowed into the gas injection hole 212 can be injected toward the gas outlet hole 214 through the injection opening 232a with a higher flow velocity. Thus, as the suction force directed toward the gas outlet hole 214 is generated in the suction flow passage 236 through the ejector effect whereby the processing gas flow is used as a driving flow, the processing gas leak into a small gap that may have been formed at the boundary with the electrode plate 206 due to thermal expansion or the like can be inhibited. In addition, even if a processing gas leak should occur, the leaked processing gas can still be let out through the gas outlet hole 214. This means that even when thermal expansion occurs at the upper electrode 200, the processing gas can be let out through all the processing gas supply holes 211 at the expected specific flow rate at all times, enabling desired processing to be executed over the entire surface of the wafer W.

It is to be noted that while the processing gas supply hole structures by taking advantage of the ejector effect in the first and second embodiments, as shown in FIGS. 2 through 5 are adopted in all the processing gas supply holes 211 in FIG. 1 the present invention is not limited to these examples and a processing gas supply hole structure achieved by utilizing the ejector effect may be adopted in only some of the plurality of processing gas supply holes 211 in FIG. 1 and the other processing gas supply holes (such as that shown FIG. 8) may assume a structure that does not induce the ejector effect.

For instance, a processing gas supply hole structure achieved by taking advantage of the ejector effect, such as that achieved in either embodiment, may be adopted only in processing gas supply holes 211 present over an area where a gap tends to form readily at the boundary of the processing gas supply mechanism main unit 201 and the electrode plate 206, among the plurality of processing gas supply holes 211 shown in FIG. 1. Depending upon the extents of thermal expansion of the processing gas supply mechanism main unit 201 and the electrode plate 206 and the variance in the temperature distribution at the processing gas supply mechanism main unit 201 and the electrode plate 206, there may be an area where a gap tends to form readily and also an area where such a gap does not form readily at the boundary of the processing gas supply mechanism main unit 201 and the electrode plate 206. Under these circumstances, the full advantage of the present invention can be realized simply by adopting the processing gas supply hole structure achieved based upon the ejector effect in the processing gas supply holes 211 present over the area where the processing gas may leak. In other words, a simpler processing gas supply hole structure similar to that disclosed in the related art may be adopted in the other processing gas supply holes 211.

In more specific terms, if the temperature at the upper electrode 200 rises to the highest level at the central area and tends to be lower toward the peripheral edge during the plasma processing, hardly any gap will form and thus hardly any processing gas leak will occur at the central area but a gap will form more readily and thus a processing gas leak will occur more readily further toward the peripheral edge at the boundary of the cooling plate 204 and the electrode plate 206.

Figure 8:
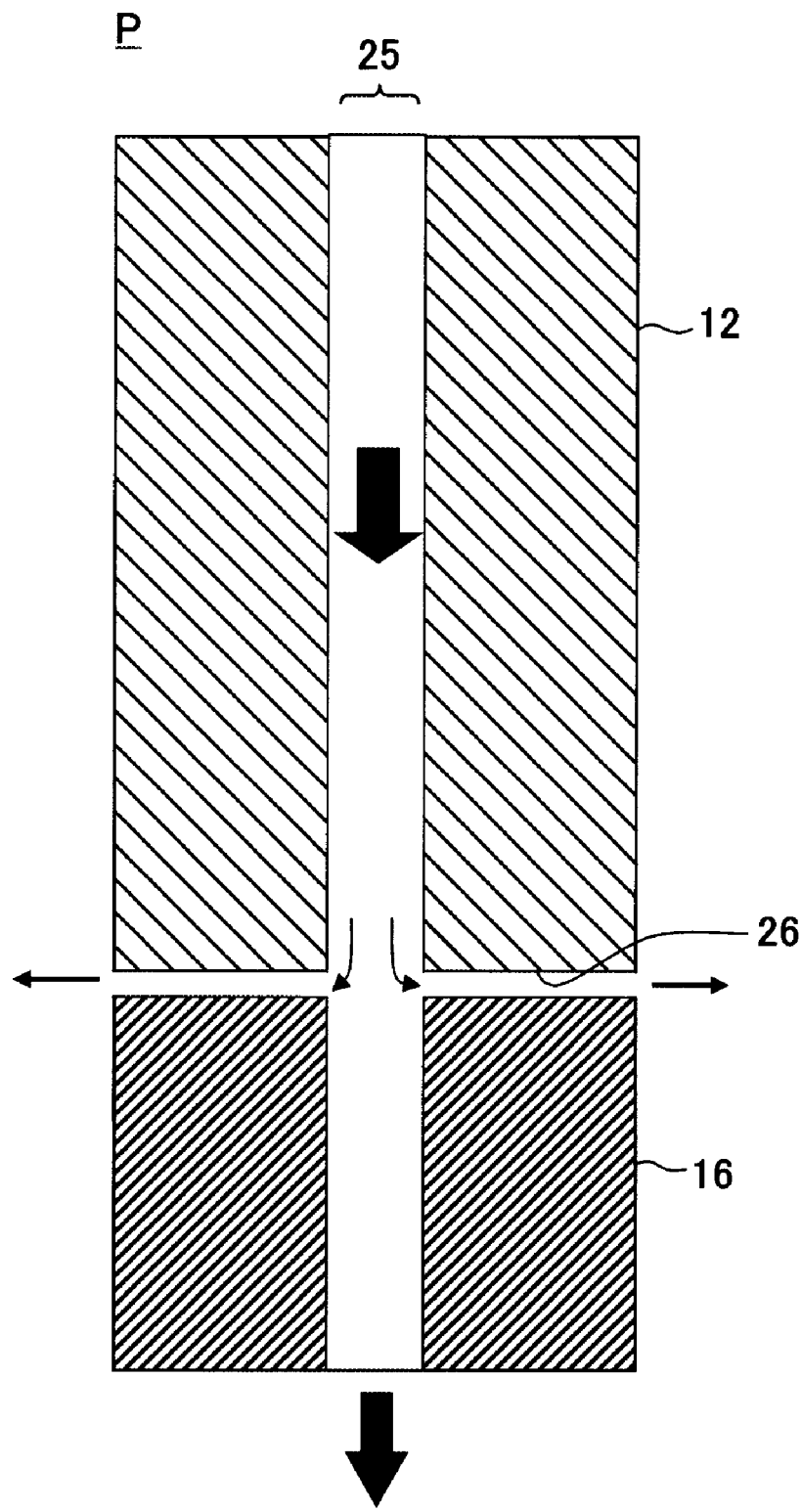
FIG. 8 illustrates how the processing gas is supplied in the related art in an enlarged sectional view of an area P over which one of the processing gas supply holes in FIG. 7 is formed.

In such case, the processing gas supply hole structure achieved by taking advantage of the ejector effect only needs to be adopted in the processing gas supply holes 211 present over the peripheral edge area where a gap will form readily but a simpler processing gas supply hole structure in the related art, such as that shown in FIG. 8, can be adopted in the processing gas supply holes 211 present in the central area where a gap will not form readily. In this combination structure, too, the processing gas leak can be inhibited to a sufficient extent.

In addition, the processing gas supply hole structure achieved by taking advantage of the ejector effect may be adopted only in processing gas supply holes 211 present in the area further outside the area Wa (the area directly above the wafer) facing opposite the wafer W placed on the lower electrode 104, among the plurality of processing gas supply holes 211 shown in FIG. 1.

Figure 6:
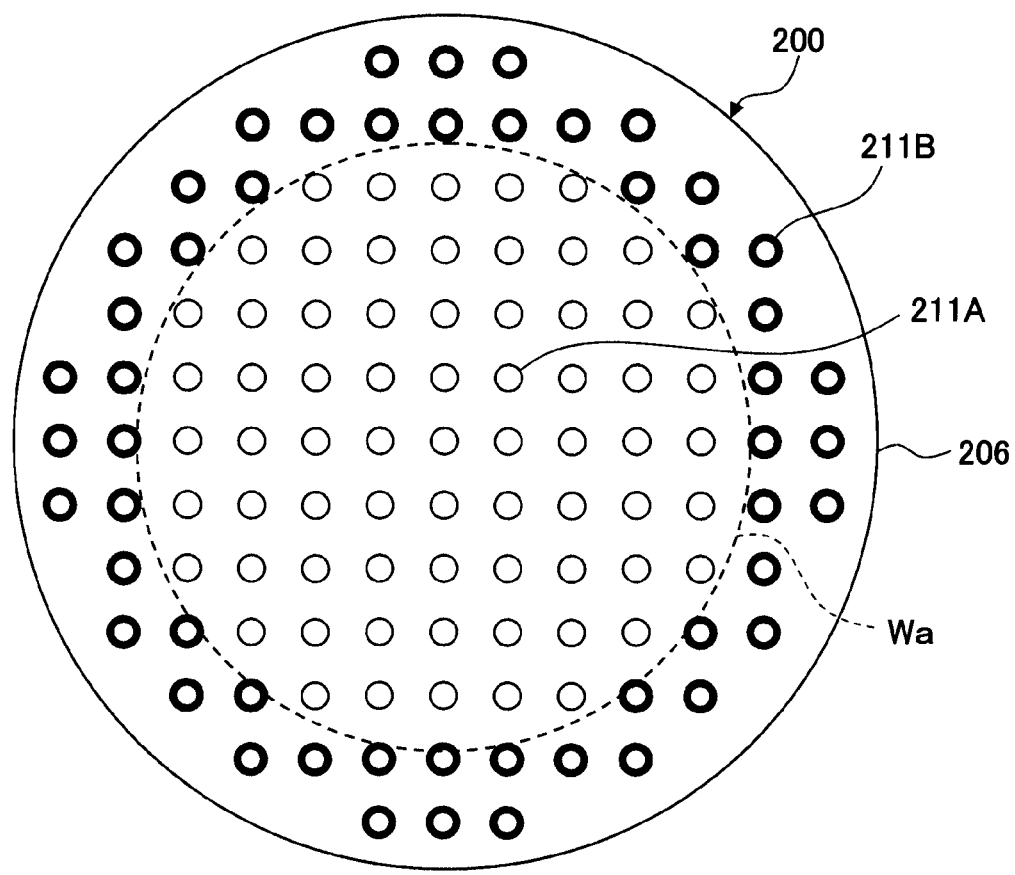
FIG. 6 presents an application example for processing gas supply holes through which the processing gas is supplied by taking advantage of the ejector effect, in a plan view of the upper electrode in FIG. 1 taken from below.
Figure 7:
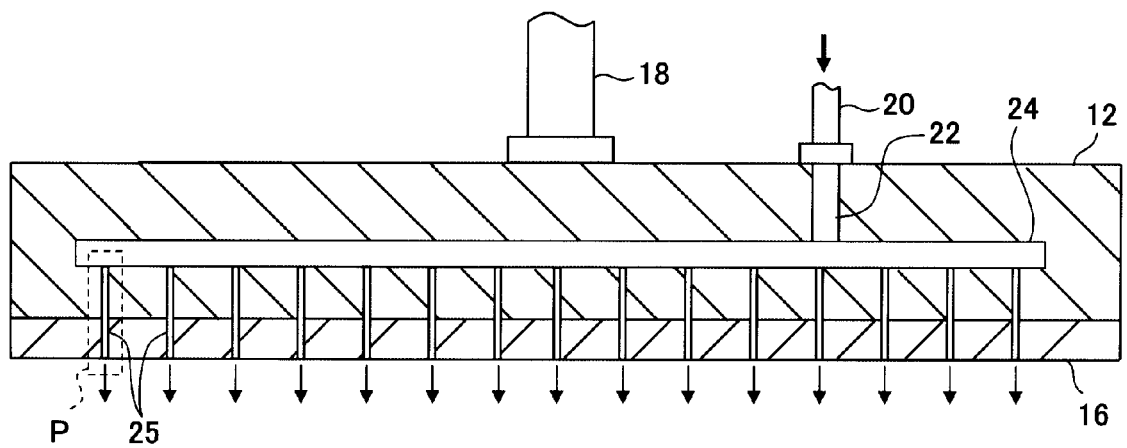
FIG. 7 schematically illustrates the structure of an upper electrode in the related art in a sectional view.

An explanation is now given in reference to FIG. 6 on an application example for the processing gas supply hole structure achieved by taking advantage of the ejector effect, in conjunction with an upper electrode 200 having processing gas supply holes 211 formed in a matrix pattern. FIG. 6 is a plan view of the upper electrode 200 in FIG. 1 taken from the bottom side, i.e., a plan view of the upper electrode taken from the lower electrode side. As in FIG. 1, FIG. 6 shows a smaller number of processing gas supply holes 211 than the actual number of processing gas supply holes, so as to simplify the illustration. In addition, the processing gas supply holes 211 may assume positions other than those shown in FIG. 6.

Among the processing gas supply holes shown in FIG. 6, the processing gas supply hole structure achieved by taking advantage of the ejector effect is adopted in the processing gas supply holes (referred to as "processing gas supply holes 211B") present over the area further outward relative to the area directly above the wafer W. The processing gas supply holes 211*b* which are indicated by bold line circles. A processing gas supply hole structure of the related art, such as that shown in FIG. 8, is adopted in the processing gas supply holes (referred to as "processing gas supply holes 211A") present in the area Wa directly above the wafer W, indicated by thin line circles.

In this combination structure, even if a gap is formed at the boundary of the processing gas supply mechanism main unit 201 and the electrode plate 206 and the processing gas leaks through the processing gas supply holes 211A assuming that structure that does not take advantage of the ejector effect, the leaked processing gas can still be let out through the processing gas supply holes 211B adopting the structure achieved by taking advantage of the ejector effect, located further outward beyond the area Wa directly above the wafer W. Namely, the processing gas having leaked into the boundary of the processing gas supply mechanism main unit 201 and the electrode plate 206 will flow from the outside into the void portions 260 of processing gas supply holes 211B structured as shown in, for instance, FIG. 3 and will then be let out through the gas outlet holes 214 via the suction flow passages 236. In other words, the processing gas having leaked can still be let out into the processing chamber through the processing gas supply holes 211B.

It is to be noted that while the flow rate of the processing gas let out through the processing gas supply holes 211B may increase, the processing gas let out through the processing gas supply holes 211B located further outward beyond the area Wa directly above the wafer W, does not affect the processing being executed on the wafer W and, furthermore, such processing gas will form a gas curtain to enclose the processing gas let out into the area Wa directly above the wafer W. As a result, the processing gas let out into the area Wa directly above the wafer W is not allowed to readily disperse toward the outside, which, in turn, improves the efficiency with which the wafer W is processed with the processing gas.

Furthermore, generally speaking, the areal ratio of the area of the wafer W to which the processing gas let out through a given processing gas supply hole at the expected flow rate is applied is greater in the peripheral area of the wafer W than in the central area of the wafer W undergoing plasma processing. Thus, if the flow rate of the processing gas let out through the processing gas supply holes in the peripheral area is lowered, the processing results at the peripheral area of the wafer W will be affected significantly. In this aspect, too, the advantage of adopting the processing gas supply hole structure according to the present invention achieved by taking advantage of the ejector effect at least in the processing gas supply holes in the peripheral area and letting out the processing gas at the expected flow rate through the individual processing gas supply holes is noteworthy.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the embodiments of the present invention have been described in reference to examples in which the present invention is adopted in a plane-parallel plasma processing apparatus, the present invention is not limited to these examples and it may be adopted in any of various other types of plasma processing apparatuses including a magnetron-type plasma processing apparatus and an inductively coupled plasma processing apparatus. In addition, the present invention may be adopted in processing apparatuses that execute processing other than etching, such as ashing and film formation, as long as they are equipped with a gas supply mechanism through which a processing gas is supplied toward a processing target substrate.

What it claimed is:

1. A processing gas supply mechanism that is disposed so as to face opposite a stage inside a processing chamber and supplies a processing gas toward a processing target substrate held on said stage, comprising:
   a processing gas delivery port through which the processing gas is delivered;
   a processing gas supply mechanism main unit having formed therein a diffusion chamber through which said processing gas delivered through said processing gas delivery port is diffused;
   a plate member layered over said processing gas supply mechanism main unit on a side thereof toward said stage and constituted of a material with a coefficient of thermal expansion different from said processing gas supply mechanism main unit; and
   a plurality of processing gas supply holes through which the processing gas is supplied into said processing chamber from said diffusion chamber, wherein:
   said processing gas supply holes are each constituted with a gas outlet hole formed at said plate member and a gas injection hole formed at said processing gas supply mechanism main unit; and
   said gas injection hole is formed so that the processing gas flowing in from said diffusion chamber communicating with a gas injection hole on an upstream side thereof is injected toward said gas outlet hole from an injection opening at a nozzle portion disposed on a downstream side thereof, and a suction flow passage with an upstream side thereof communicating with a boundary of said gas supply mechanism main unit and said plate member and a downstream side thereof connecting to said gas outlet hole is formed around said nozzle portion.

2. A processing gas supply mechanism according to claim 1, wherein:
   said nozzle portion is formed so as to project into said gas outlet hole through a layering surface of said processing gas supply mechanism main unit and an expanded diameter portion at which said nozzle portion is held with a gap is formed at said gas outlet hole so as to open at a layering surface of said plate member in order to allow a clearance formed between said nozzle portion and said expanded diameter portion to constitute said suction flow passage.

3. A processing gas supply mechanism according to claim 2, wherein:
   said nozzle portion and said expanded diameter portion each assume a shape whereby the diameter thereof becomes smaller further toward the downstream side.

4. A processing gas supply mechanism according to claim 2, wherein:
   a void portion that surrounds the open end of said expanded diameter portion opening at the layering surface of said plate member and communicates with the upstream side of said suction flow passage, is formed at the boundary of said processing gas supply mechanism main unit and said plate member.

5. A processing gas supply mechanism according to claim 4, wherein:
   said void portion is constituted with a recess formed with the layering surface of said plate member at the open end of said expanded diameter portion.

6. A processing gas supply mechanism according to claim 1, wherein:
   said gas injection hole is formed so that the hole diameter toward the downstream side is smaller than the hole diameter on the upstream side.

7. A processing gas supply mechanism according to claim 6, wherein:
   a gas compression space is formed between the downstream-side hole and the upstream-side hole.

8. A processing gas supply mechanism according to claim 1, wherein:
   said processing gas supply mechanism main unit is constituted of metal and said plate member is constituted of a silicon-containing material.

9. A processing gas supply mechanism that is disposed so as to face opposite a stage inside a processing chamber and supplies a processing gas toward a processing target substrate held on said stage, comprising:
   a processing gas delivery port through which the processing gas is delivered;
   a processing gas supply mechanism main unit having formed therein a diffusion chamber through which the processing gas delivered through said processing gas delivery port is diffused;
   a plate member layered over said processing gas supply mechanism main unit on a side thereof toward said stage and constituted of a material with a coefficient of thermal expansion different from said processing gas supply mechanism main unit;
   a middle member layered between said processing gas supply mechanism main unit and said plate member and constituted of a material different from the material constituting said processing gas supply mechanism main unit; and
   a plurality of processing gas supply holes through which the processing gas is supplied into said processing chamber from said diffusion chamber, wherein:
   said processing gas supply holes are each constituted with a gas outlet hole formed at said plate member and a gas injection hole formed so as to range through said processing gas supply mechanism main unit and said middle member; and
   said gas injection hole is formed so that the processing gas flowing in from said diffusion chamber communicating with said gas injection hole on an upstream side thereof is injected toward said gas outlet hole from an injection opening at a nozzle portion disposed on a downstream side thereof, and a suction flow passage with an upstream side thereof communicating with a boundary of said middle member and said plate member and a downstream side thereof connecting to said gas outlet hole is formed around said nozzle portion.

10. A processing gas supply mechanism according to claim 9, wherein:
    said nozzle portion is formed so as to project into said gas outlet hole through a layering surface of said middle member by machining said middle member and an expanded diameter portion at which said nozzle portion is held with a gap is formed at said gas outlet hole so as to open at a layering surface of said plate member, in order to allow a clearance formed between said nozzle portion and said expanded diameter portion to constitute said suction flow passage.

11. A processing gas supply mechanism according to claim 10, wherein:
said nozzle portion and said expanded diameter portion each assume a shape whereby the diameter thereof becomes smaller further toward the downstream side.

12. A processing gas supply mechanism according to claim 10, wherein:
a void portion that surrounds the open end of said expanded diameter portion opening at the layering surface of said plate member and communicates with the upstream side of said suction flow passage, is formed at the boundary of said middle member and said plate member.

13. A processing gas supply mechanism according to claim 12, wherein:
said void portion is constituted with a recess formed with the layering surface of said plate member at the open end of said expanded diameter portion.

14. A processing gas supply mechanism according to claim 12, wherein:
a communicating passage connecting the boundary of said processing gas supply mechanism main unit and said middle member to said void portion, is formed at said middle member.

15. A processing gas supply mechanism according to claim 9, wherein:
said gas injection hole is formed so that the hole diameter toward the downstream side is smaller than the hole diameter on the upstream side.

16. A processing gas supply mechanism according to claim 15, wherein:
a gas compression space is formed between the downstream-side hole and the upstream-side hole.

17. A processing gas supply mechanism according to claim 9, wherein:
said processing gas supply mechanism main unit is constituted of metal and said middle member and said plate member are constituted of a silicon-containing material.

18. A processing gas supply mechanism that is disposed so as to face opposite a stage inside a processing chamber and supplies a processing gas toward a processing target substrate held on said stage, comprising:
a processing gas delivery port through which the processing gas is delivered;
a processing gas supply mechanism main unit having formed therein a diffusion chamber through which the processing gas delivered through said processing gas delivery port is diffused;
a plate member layered over said processing gas supply mechanism main unit on a side thereof toward said stage and constituted of a material with a coefficient of thermal expansion different from said processing gas supply mechanism main unit; and
a plurality of processing gas supply holes through which the processing gas is supplied into said processing chamber from said diffusion chamber, wherein:
among said plurality of processing gas supply holes, at least processing gas supply holes formed over an area further outward relative to an area facing opposite said processing target substrate placed on said stage are each constituted with a gas outlet hole formed at said plate member and a gas injection hole formed at said processing gas supply mechanism main unit; and
said gas injection hole is formed so that the processing gas flowing in from said diffusion chamber communicating with said gas injection hole on an upstream side thereof is injected toward said gas outlet hole from an injection opening at a nozzle portion disposed on a downstream side thereof, and a suction flow passage with an upstream side thereof communicating with a boundary of said gas supply mechanism main unit and said plate member and a downstream side thereof connecting to said gas outlet hole, is formed around said nozzle portion.

19. A substrate processing apparatus that executes a specific type of processing on a processing target substrate placed on a stage inside a processing chamber by supplying a processing gas into said processing chamber via a processing gas supply mechanism disposed so as to face opposite said stage, wherein:
said processing gas supply mechanism comprises:
a processing gas delivery port through which the processing gas is delivered;
a processing gas supply mechanism main unit having formed therein a diffusion chamber through which said processing gas delivered through said processing gas delivery port is diffused;
a plate member layered over said processing gas supply mechanism main unit on a side thereof toward said stage and constituted of a material with a coefficient of thermal expansion different from said processing gas supply mechanism main unit; and
a plurality of processing gas supply holes through which the processing gas is supplied into said processing chamber from said diffusion chamber;
said processing gas supply holes are each constituted with a gas outlet hole formed at said plate member and a gas injection hole formed at said processing gas supply mechanism main unit; and
said gas injection hole is formed so that the processing gas flowing in from said diffusion chamber communicating with a gas injection hole on an upstream side thereof is injected toward said gas outlet hole from an injection opening at a nozzle portion disposed on a downstream side thereof, and a suction flow passage with an upstream side thereof communicating with a boundary of said gas supply mechanism main unit and said plate member and a downstream side thereof connecting to said gas outlet hole, is formed around said nozzle portion.

20. A substrate processing apparatus that executes a specific type of processing on a processing target substrate placed on a stage inside a processing chamber with plasma raised from a processing gas by applying high-frequency power to an electrode disposed so as to face opposite said stage in said processing chamber, wherein:
said electrode comprises:
a processing gas delivery port through which the processing gas is delivered;
a processing gas supply mechanism main unit having formed therein a diffusion chamber through which said processing gas delivered through said processing gas delivery port is diffused;
an electrode plate layered over said processing gas supply mechanism main unit on a side thereof toward said stage and constituted of a material with a coefficient of thermal expansion different from said processing gas supply mechanism main unit; and
a plurality of processing gas supply holes through which the processing gas is supplied into said processing chamber from said diffusion chamber;
said processing gas supply holes are each constituted with a gas outlet hole formed at said plate member and a gas injection hole formed at said processing gas supply mechanism main unit; and said gas injection hole is formed so that the processing gas flowing in from said diffusion chamber communicating with said gas injection hole on an upstream side thereof is injected toward said gas outlet hole from an injection opening at a nozzle portion disposed on a downstream side thereof, and a suction flow passage with an upstream side thereof communicating with a boundary of said gas supply mechanism main unit and said plate member and a downstream side thereof connecting to said gas outlet hole is formed around said nozzle portion.

* * * * *